(12) United States Patent
Sakakidani et al.

(10) Patent No.: US 8,389,350 B2
(45) Date of Patent: Mar. 5, 2013

(54) SEMICONDUCTOR DEVICE AND METHOD FOR MANUFACTURING THE SAME IN WHICH VARIATIONS ARE REDUCED AND CHARACTERISTICS ARE IMPROVED

(75) Inventors: Akihito Sakakidani, Kanagawa (JP); Kiyotaka Imai, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/178,248

(22) Filed: Jul. 7, 2011

(65) Prior Publication Data

US 2012/0007194 A1 Jan. 12, 2012

(30) Foreign Application Priority Data

Jul. 7, 2010 (JP) .................. 2010-154846

(51) Int. Cl.
*H01L 21/336* (2006.01)
(52) U.S. Cl. ........................ 438/197; 257/402
(58) Field of Classification Search .................. 257/401, 257/402, 305, 341; 438/197
See application file for complete search history.

(56) References Cited

U.S. PATENT DOCUMENTS

| | | | | |
|---|---|---|---|---|
| 7,217,627 | B2 * | 5/2007 | Kim ............................ | 438/305 |
| 7,514,328 | B2 * | 4/2009 | Rao ............................. | 438/285 |
| 7,618,853 | B2 * | 11/2009 | Belyansky et al. ........... | 438/197 |
| 7,838,369 | B2 * | 11/2010 | Bulucea ...................... | 438/290 |
| 2006/0068556 | A1 | 3/2006 | Noda | |
| 2007/0105297 | A1 * | 5/2007 | Jeong et al. ................. | 438/197 |
| 2007/0161169 | A1 * | 7/2007 | Belyansky et al. ........... | 438/197 |
| 2008/0197424 | A1 * | 8/2008 | Haensch et al. .............. | 257/407 |
| 2008/0277733 | A1 | 11/2008 | Fukutome | |
| 2008/0293194 | A1 * | 11/2008 | Chen et al. ................... | 438/199 |
| 2009/0278209 | A1 | 11/2009 | Noda | |

FOREIGN PATENT DOCUMENTS

| | | |
|---|---|---|
| JP | 10-125916 A | 5/1998 |
| JP | 2006-059843 A | 3/2006 |
| JP | 2006-121025 A | 5/2006 |
| JP | 2009-060130 A | 3/2009 |
| JP | 2009-272423 A | 11/2009 |
| WO | 2007/096976 A1 | 8/2007 |

OTHER PUBLICATIONS

F. Arnaud, et al., "Competitive and Cost Effective high-k based 28nm CMOS Technology for Low Power Applications", IEDM Technology Digest, 2009, pp. 28.2.1-28.2.4.

(Continued)

*Primary Examiner* — Thao P. Le
(74) *Attorney, Agent, or Firm* — Sughrue Mion, PLLC

(57) ABSTRACT

A method of manufacturing N-type MOSFET includes: implanting a p-type dopant into in a surface layer of a semiconductor substrate to form a channel region; forming a gate insulating film including High-k material and a gate electrode on said channel region; implanting a p-type dopant into both ends of said channel region in an inner portion of said semiconductor substrate to form halo regions; implanting a p-type dopant into both ends of said channel region in a surface layer of said semiconductor substrate to form extension regions. One of said step of forming said channel region and said step of forming halo regions includes: implanting C into one of said channel region and said halo regions. An inclusion amount of said High-k material is an amount that increase of a threshold voltage caused by said High-k material being included in said gate insulating film compensates for decrease of said threshold voltage caused by said C being implanted.

20 Claims, 14 Drawing Sheets

OTHER PUBLICATIONS

Marcel J. M. Pelgrom, et al., "Matching Properties of MOS Transistors", IEEE Journal of Solid-State Circuits, Oct. 1989, pp. 1433-1440, vol. 24, No. 5.

K. Takeuchi, et al., "Understanding Random Threshold Voltage Fluctuation by Comparing Multiple Fabs and Technologies", IEDM Technology Digest, 2007, pp. 467-470.

K. Takeuchi, et al., "Single-Charge-Based Modeling of Transistor Characteristics Fluctuations Based on Statistical Measurement of RTN Amplitude", Symposium on VLSI Technology Digest, 2009, pp. 54-55.

C. H. Jan, et al., "A 32nm SoC Platform Technology with $2^{nd}$ Generation High-k/Metal Gate Transistors Optimized for Ultra Low Power, High Performance, and High Density Product Applications", IEDM Technology Digest, 2009, pp. 28.2.1-28.2.4.

* cited by examiner

SEMICONDUCTOR DEVICE AND METHOD FOR MANUFACTURING THE SAME IN WHICH VARIATIONS ARE REDUCED AND CHARACTERISTICS ARE IMPROVED

CROSS REFERENCE TO RELATED APPLICATIONS

The present application claims the benefit of patent application number 2010-154846, filed in Japan on Jul. 7, 2010, the subject matter of which is hereby incorporated herein by reference.

BACKGROUND

1. Field of the Invention

The present invention relates to a semiconductor device and a method for manufacturing a semiconductor device, and in particular, relates to a semiconductor device and a method for manufacturing a semiconductor device in which variations are reduced and characteristics are improved.

2. Description of Related Art

In semiconductor processes after the 90 nm generation, variations in transistor characteristics like Ion (on-state current)/Vth (threshold voltage) of a MOS (Metal-Oxide Semiconductor) transistor are greatly developed due to miniaturization of elements. As a result, there is a situation where variations in transistor characteristics greatly affect a performance yield at an LSI (Large-Scale Integration) manufacturing stage. Additionally, great variations in transistor characteristics have to be coped with at an LSI circuit designing stage, leading to lengthening of a designing period and increase of development costs. As mentioned above, great increase in variations in transistor characteristics is a great barrier in LSI designing and manufacturing.

In particular, random variations greatly concerned with variations in transistor characteristics, have become a great dominating factor as a process of the miniaturization generation advances. For this reason, various companies involved in semiconductor manufacturing report some investigations of random variations, trial production and proposals aimed at reduction in random variations, as shown in, for example, the non-patent literature 1, 2, 3, and 4. Here, the non-patent literature 1 is: F. Arnaud et al., "Competitive and Cost Effective high-k based 28 nm CMOS Technology for Low Power Applications" in IEDM Tech. Dig, 2009. The non-patent literature 2 is: M. J. M Pelgrom et al., "Matching Properties of MOS Transistors" in IEEE Solid-State Circuits, p. 1433, 1989. The non-patent literature 3 is: K. Takeuchi et al, "Understanding Random Threshold Voltage Fluctuation by Comparing Multiple Fabs and Technologies" in IEDM. Tech. Dig., 2007. The non-patent literature 4 is: K. Takeuchi et al, "Single-Charge-Based Modeling of Transistor Characteristics Fluctuations Based on Statistical Measurement of RTN Amplitude" in VLSI Symp. Tech. Dig., 2009.

It is known that random variations are expressed by a criteria expression as represented by the Pelgrom plot (the non-patent literature 2 and 3). According to the criteria expression, random variations depend on an Lg dimension (gate length), a Wg dimension (gate width), a Tinv (thickness of an inversion layer; equivalent oxide thickness), and an Nsub (an impurity concentration under a gate) of a transistor. In recent years, the Takeuchi plot, which is further standardized from the above criteria expression, has been reported (the non-patent literatures 3 and 4). According to the criteria expression of the Takeuchi plot, random variations depend not only on a Lg, a Wg, and a Tinv as mentioned above, but also on a Vth and a Vfb (flat band voltage).

In view of the dependence tendency shown by the above criteria expressions, random variations keep on increasing as an Lg dimension and a Wg dimension of a transistor shrink due to the advancement of miniaturization. However, increase in random variations can be prevented since a Tinv is reduced (thinned) as a result of the advancement of miniaturization.

However, the number of transistors provided in an LSI is greatly increased due to the advancement of the miniaturization technology. In a case of an SRAM macro therefore, it is necessary to anticipate greater random variations σ (standard deviations) which follow normal distribution as a premise, compared with a case of a previous generation. As a result, there is a risk that reduction in operation margins and reduction in yields in terms of circuit design occur. For the miniaturization generation of the recent years therefore, a method for reducing random variations with factors other than a Tinv is desired. Additionally, it is desirable that fluctuation in characteristics and degradation of performance due to the reduction in random variations should be avoided at the same time.

As a related technique, Japanese Patent Publication JP-P2006-59843A (the patent literature 1) discloses a semiconductor device and a method for manufacturing the semiconductor device. The object is to control diffusion of boron in extension portions of source/drain regions in a PMOSFET, so that short-channel effect can be controlled and operation of a more miniaturized PMOSFET can be secured. The semiconductor device has an n-well region, a gate electrode, boron diffusion regions, diffusion regions with diffusion controlling elements, and a p-type impurity diffusion region. The n-well region is formed in a semiconductor substrate. The gate electrode is formed on the n-well region. The boron diffusion regions are formed in a surface layer of the n-well on the both ends of the gate electrode. The diffusion regions with diffusion controlling elements, in which at least one kind of diffusion controlling elements selected from a group of fluorine, nitrogen and carbon, is diffused, include the boron diffusion regions at least in a lateral direction under the gate electrode from the boron diffusion layers. The p-type impurity diffusion region is positioned deeper than the boron diffusion regions so that the ends in a lateral direction are separated farther from the end of the gate electrode than the ends in a lateral direction of the boron diffusion region.

As a related technique, Japanese Patent Publication JP-P2006-121025A (the patent literature 2; US2006068556 (A1)) discloses a semiconductor device and a method for manufacturing the semiconductor device. The object is to control short-channel effect with steep and shallow junction of an impurity concentration profile in a channel diffusion layer, and maintain high drive force with a low-resistance channel diffusion layer having a sufficient activation concentration. The semiconductor device includes a gate insulating film, a gate electrode, and a channel diffusion layer. A gate insulating film is formed on a semiconductor region of a first conductivity type. The gate electrode is formed on the gate insulating film. The channel diffusion layer, which is a first conductivity type, is formed below the gate electrode in the semiconductor region. The channel diffusion layer includes carbon as impurities.

Japanese Patent Publication JP-P2009-272423A (the patent literature 3; US2009278209 (A1)) discloses a semiconductor device and a method for manufacturing the semiconductor device. The object is to achieve shallow junction and low resistance of extension diffusion layers following miniaturization, and achieve a miniaturized device having high drive force. The semiconductor device includes a gate electrode, extension diffusion layers, and source/drain diffusion layers. The gate electrode is formed on a semiconductor region, with a gate insulating film therebetween. The extension diffusion layers, in which first impurities of a first conductivity type are diffused, are formed on both sides of the gate electrode in the semiconductor region. The source/drain diffusion layers are positioned outside the extension diffusion layers in the semiconductor region and the junction depth of the source/drain diffusion layers is deeper than that of the extension diffusion layers. The extension diffusion layers include carbon on at least one of the both sides of the gate electrode.

Japanese Patent Publication JP-P2009-60130A (the patent literature 4; US2006068556 (A1)) discloses a semiconductor device and a method for manufacturing the semiconductor device. The object is to control short-channel effect with steep and shallow junction of an impurity concentration profile in a channel diffusion layer, and maintain high drive force with a low-resistance channel diffusion layer having a sufficient activation concentration. The semiconductor device includes a gate insulating film, a gate electrode, extension diffusion layers, and pocket diffusion layers. The gate insulating film is formed on a semiconductor region of a first conductivity type. The gate electrode is formed on the gate insulating film. The extension diffusion layers, which are a second conductivity type, are formed under the sides of the gate electrode in the semiconductor region. The pocket diffusion layers, which are a first conductivity type, are formed under the extension diffusion layers in the semiconductor region, in contact with the extension diffusion layers. The pocket diffusion layers include carbon as impurities.

Japanese Patent Publication JP-A-Heisei 10-125916 (the patent literature 5) discloses a semiconductor device and a method for manufacturing the semiconductor device. The object is to miniaturize a transistor while having a precise threshold voltage, by providing a means to prevent expansion in a depth direction of such an impurity diffusion layer as a source/drain region. The semiconductor device includes a semiconductor substrate, a substrate region, a gate insulating film, a gate electrode, source/drain regions, and carbon-doped regions. The substrate region, which is a first conductivity type, is formed in the semiconductor substrate. The gate insulating film is formed on the semiconductor substrate. The gate electrode is formed on the gate insulating film. The source/drain regions, which are a second conductivity type, are formed in regions positioned on the both sides of the gate electrode in the semiconductor substrate. The carbon-doped regions are formed in regions which at least overlap the source/drain regions.

WO2007/096976 (the patent literature 6; US2008277733 (A1)) discloses a semiconductor device and a method for manufacturing the semiconductor device. The semiconductor device includes a semiconductor substrate, a gate electrode, source and drain extension regions, a first piezoelectric material pattern, a second piezoelectric material pattern, and source and drain regions. The gate electrode is formed on the semiconductor substrate. The source and drain extension regions are formed on first and second sides which correspond to first and second sidewall surfaces of the gate electrode respectively, in the semiconductor region. The first piezoelectric material pattern covers the semiconductor substrate continuously from the first side of the gate electrode to the first sidewall surface of the gate electrode. The second piezoelectric material pattern covers the semiconductor substrate continuously from the second side of the gate electrode to the second sidewall surface of the gate electrode. The source and drain regions are formed outside the source and drain extension regions, in the semiconductor substrate. Pocket implantation regions are formed to overlap the source and drain extension regions. Pocket implantation is performed by adding nitrogen, fluorine, and carbon for example when needed.

The inventors have now discovered the following facts.

The inventors have now found that addition of a C (carbon) factor into a Halo implantation process is effective in addition to a method where a Tinv is thinned, as a method for reducing random variations in an NMOS transistor. As an example, a semiconductor device, with which the effect is proven by the inventors, will be described below.

FIG. 1 is a sectional view showing an example of a configuration of a semiconductor device with which effect is proven by the inventors. A semiconductor device 2 is an NMOS transistor, which is one of the NMOSFETs (N-channel Metal Oxide Semiconductor Field Effect Transistor), has a channel region 20, extension regions 26, source/drain regions 21, halo regions 27, a gate insulating film 23, a gate electrode 22, offset spacers 24, and sidewalls 29.

The channel region 20 is formed in a surface layer of a semiconductor substrate. The extension regions 26 are formed on the both ends of the channel region 20, in the surface layer of the semiconductor substrate. The source/drain regions 21 are formed at the ends of the extension regions 26, opposite to the channel region 20, in the surface layer of the semiconductor substrate. The halo regions 27 are formed under the extension regions 26 in the semiconductor substrate. The gate insulating film 23 is formed on the channel region 20. The gate electrode 22 is formed on the gate insulating film 23. The offset spacers 24 are formed to the side surfaces of the gate electrode 22. The sidewalls 29 are formed to the side surfaces of the offset spacers 24, on the extension regions 26. In the channel region 20, a channel impurity region 25 in which impurities (e.g. boron) are doped, is formed. Carbon is implanted from the surface of the semiconductor substrate including the extension regions 26 and the halo regions 27, to inside regions 28. Additionally, carbon is implanted from the channel region 20 including the channel impurity region 25, to an inside region 28a.

FIG. 2 is a flow diagram showing a method for manufacturing the semiconductor device in FIG. 1. First, a diffusion layer is formed in a predetermined region in the surface layer of the semiconductor substrate (step S31). Next, channel implantation is performed into the channel region 20 to form the channel impurity region 25, in order to control a threshold voltage Vth (step S32). Next, the gate insulating film 23, which is a SiON (silicon oxynitride) film, is formed on the channel region 20 (step S33). At this time, the gate insulating film may be a $SiO_2$ (silicon oxide) film. After that, the gate electrode 22 is formed of Poly-Si (polysilicon) (step S34). Next, after forming the offset spacers 24, the halo regions 27 are formed by performing halo implantation (step S35) and the extension regions 26 are formed by performing extension implantation (step S36) for the purpose of overlap adjustment under the gate (suppressing of the short channel effect). After that, the sidewalls 29 are formed (step S37), and source/drain implantation is performed to form the source/drain regions 21 (step S38).

The implantation factors of the channel implantation, the halo implantation, and the extension implantation used for the steps S32, S35, and S36, are B (boron), $BF_2$ (boron difluoride), and As (arsenic), respectively. The implantation condition of B is: 12 keV, $4\times10^{+12}$–$12\times10^{+12}/cm^2$; the implantation condition of $BF_2$ is: 29 keV, $4.8\times10^{+13}/cm^2$, 15 degrees; and the implantation condition of As is: 7 keV, $5\times10^{+14}/cm^2$, respectively. At this time, P (phosphorus) instead of As, and B (boron) instead of $BF_2$, may be used. Note that the above implantation conditions are just one example, and conditions used in a CMOS process flow in each generation are possible. Additionally, other steps may be the same as the ordinary CMOS process flow.

The improvement method by the inventors is different from an ordinary CMOS process flow, in that carbon implantation (step S41) is applied before halo implantation when the halo implantation (step S35) is performed. In the carbon implantation (step S41), an implantation condition of C (carbon) is: 7 keV and $5 \times 10^{+14}/cm^2$. It is preferable that the C implantation condition should be an energy condition which corresponds to an active B depth under a transistor formed by halo implantation. It is also preferable that a dose of C should be two times or over two times the total of a dose of B at channel implantation and a dose of B at halo implantation. At this time, C implantation may be applied after halo implantation.

Characteristics of an NMOS transistor manufactured by using the above manufacturing method will be described.

FIG. 3 is a graph showing the relationship between a random variation in a threshold voltage Vth and a dose of B of channel implantation. A vertical axis and a horizontal axis show a random variation in a threshold voltage Vth (standard deviation σ (Vth)) and a dose of B of channel implantation (Channel Dose), respectively. FIG. 4 is a graph showing the relationship between a random variation in a threshold voltage Vth and a threshold voltage Vth. A vertical axis and a horizontal axis show a random variation in a threshold voltage Vth (σ(Vth)) and a threshold voltage Vth, respectively. In FIG. 3 and FIG. 4, diamonds and a solid line connecting the diamonds, show a case where C implantation (step S41) is not applied at the time of halo implantation (step S35). Squares and a broken line connecting the squares show a case where C implantation (step S41) is applied at the time of halo implantation (step S35). In the manufacturing method, process conditions are the same for each NMOS transistor, excluding a dose of B of channel implantation and application of C implantation. As for the dimensions of the measured NMOS transistor, an Lg (gate length) is 60 nm; and a Wg (gate width) is 100 nm.

As shown in FIG. 3, the case where C implantation is applied (squares/broken line) and the case where C implantation is not applied (diamonds/solid line) are compared, with the same channel dose condition. It is understood that the random variation σ (Vth) in a threshold voltage Vth is reduced approximately by 20% by applying the C implantation. For example, when a channel dose condition is $10 \times 10^{+12}/cm^2$, σ (Vth) is reduced approximately by 22% from about 45 mV to about 35 mV, by applying the C implantation.

As shown in FIG. 4, the case where C implantation is applied (squares/broken line) and the case where C implantation is not applied (diamonds/solid line) are compared, with the same threshold voltage Vth. It is understood that the random variation σ (Vth) in a threshold voltage Vth is reduced approximately by 20% by applying the C implantation. For example, when a threshold voltage Vth is 400 mV, σ (Vth) is reduced approximately by 20% from about 41 mV to about 33 mV, by applying the C implantation.

As shown by the above tendencies, it has been revealed that random variations can be reduced by applying the C implantation (step S41) to the halo implantation (stepS35). However, further research by the inventors has revealed that the following problem occurs when C implantation is performed. FIG. 5 is a graph showing the relationship between a threshold voltage Vth and a dose of B of channel implantation. A vertical axis and a horizontal axis show a threshold voltage Vth and a dose of B of channel implantation (Channel Dose), respectively. FIG. 5 is a graph in which FIG. 3 and FIG. 4 are combined. As shown in FIG. 5, the case where C implantation is applied (squares/broken line) and the case where C implantation is not applied (diamonds/solid line) are compared, with the same channel dose condition. It is understood that a threshold voltage Vth is lowered by applying the C implantation, under the same channel dose condition. Therefore, it is necessary to improve a shifted (lowered) threshold voltage Vth to a desired value in some way.

As a method for improving a shifted threshold voltage Vth, a method can be considered in which a dose of B is made to be higher in the channel implantation. From the Pelgrom plot mentioned above, it is generally known that random variations in a threshold voltage Vth depend on an Nsub under a gate (an impurity concentration under a gate). Therefore, an Nsub (an impurity concentration under a gate) is naturally increased as a dose of B of the channel implantation is increased. As a result, there is a problem that random variations are increased accordingly.

As a method for improving a shifted threshold voltage Vth, a method can also be considered in which a dose of $BF_2$ (or B) is made to be higher in the halo implantation. When a dose of $BF_2$ (or B) is made to be higher in the halo implantation however, an Nsub (an impurity concentration under agate) is increased. As a result, random variations are increased accordingly. At the same time, it is concerned that an off-leakage component of a transistor possibly increases since a GIDL (Gate Induced Drain Leakage) component and a JL (Junction Leakage) component are also increased. For this reason, a method which can control a threshold voltage Vth without increasing an impurity concentration under a gate, is required.

It is considered that the reduction of random variations as a result of the application of the C implantation is attributed to control of TED (Transient Enhanced Diffusion) of B by a C factor, and to suppress a tendency for B to increase in high concentration under a channel, as shown in the patent literatures 1 to 5. It has been proved that random variations in a threshold voltage Vth are generally greater in NMOSs than in PMOSs (the non-patent literature 3).

A technique which can reduce random variations in transistors and control transistor characteristics at desired values is desired.

SUMMARY

The present invention seeks to solve one or more of the above problems, or to improve upon those problems at least in part.

In one embodiment, a method of manufacturing N-type MOSFET includes: implanting a p-type dopant into in a surface layer of a semiconductor substrate to form a channel region; forming a gate insulating film including High-k material and a gate electrode on the channel region; implanting a p-type dopant into both ends of the channel region in an inner portion of the semiconductor substrate to form halo regions; implanting a p-type dopant into both ends of the channel region in a surface layer of the semiconductor substrate to form extension regions. One of the step of forming the channel region and the step of forming halo regions includes: implanting C into one of the channel region and the halo regions. An inclusion amount of the High-k material is an amount that increase of a threshold voltage caused by the High-k material being included in the gate insulating film compensates for decrease of the threshold voltage caused by the C being implanted.

In another embodiment, a N-type MOSFET includes: a channel region configured to be formed in a surface layer of a semiconductor substrate; extension regions configured to be formed on both ends of the channel region in a surface layer of the semiconductor substrate; halo regions configured to be formed under the extension regions; a gate insulating film configured to be formed on the channel region and include High-k material; and a gate electrode configured to be formed on the gate insulating film. C is implanted into one of the channel region and the halo regions. An inclusion amount of the High-k material is an amount that increase of a threshold voltage caused by the High-k material being included in the gate insulating film compensates for decrease of the threshold voltage caused by the C being implanted.

According to the present invention, it is possible to reduce random variations in transistors and control transistor characteristics at desired values.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

A semiconductor device and a method for manufacturing a semiconductor device according to embodiments of the present invention will be described below with reference to the attached drawings.

A technique according to the embodiment, organically combines a technique for reducing random variations by performing C implantation to a halo implantation process and/or a channel implantation process, and a technique for changing a threshold voltage Vth by adding Hf for example in a gate insulating film forming process. The combined technique makes it possible to compensate for a threshold voltage Vth shifted as a result of C implantation and maintain transistor characteristics while maintaining reduction of random variations.

Figure 6:
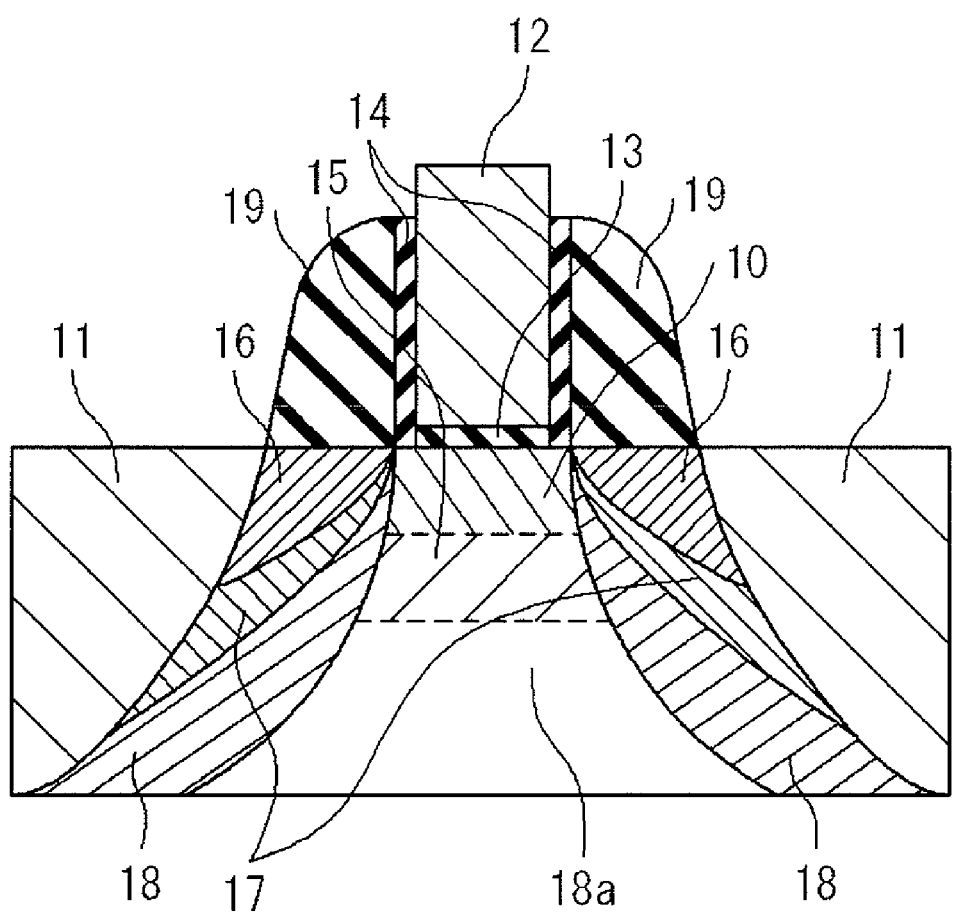
FIG. 6 is a sectional view showing an example of a configuration of a semiconductor device according to an embodiment of the present invention.

First, a configuration of a semiconductor device according to an embodiment of the present invention will be described. FIG. 6 is a sectional view showing an example of a configuration of a semiconductor device according to an embodiment of the present invention. A semiconductor device 1 is an NMOS transistor, which is one of NMOSFETs (N-type Metal Oxide Semiconductor Field Effect Transistor), and includes a channel region 10, extension regions 16, source/drain regions 11, halo regions 17, a gate insulating film 13, a gate electrode 12, offset spacers 14, and sidewalls 19.

The channel region 10 is formed in a surface layer of a semiconductor substrate. The extension regions 16 are formed on the both ends of the channel region 10 in the surface layer of the semiconductor substrate. The source/drain regions 11 are formed at the ends of the extension regions 16 opposite to the channel region 10, in the surface layer of the semiconductor substrate. The halo regions 17 are formed under the extension regions 16 in the semiconductor substrate (the halo regions 17 may also extend to the lower side of the channel region 10). The gate insulating film 13 is formed on the channel region 10. The gate electrode 12 is formed on the gate insulating film 13. The offset spacers 14 are formed to the sides of the gate electrode 12. The sidewalls 19 are formed to the sides of the offset spacers 14, on the extension regions 16. In the channel region 10, a channel impurity region 15 in which impurities (e.g. boron) are doped is formed. Carbon is implanted from the surface of the semiconductor substrate including the extension regions 16 and the halo regions 17 to inside regions 18. Furthermore, carbon is implanted from the channel region 10 including the channel impurity region 15 to an inside 18a.

Figure 1:
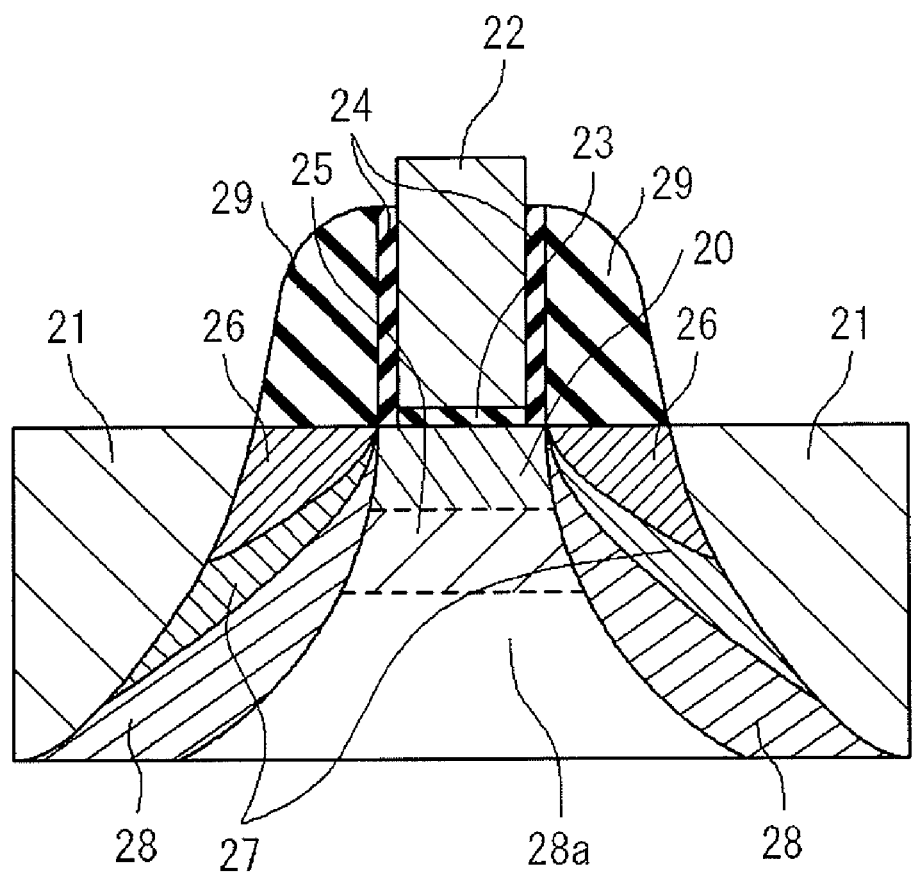
FIG. 1 is a sectional view showing an example of a configuration of a semiconductor device with which effect is proven by the inventors of the present invention.
Figure 5:
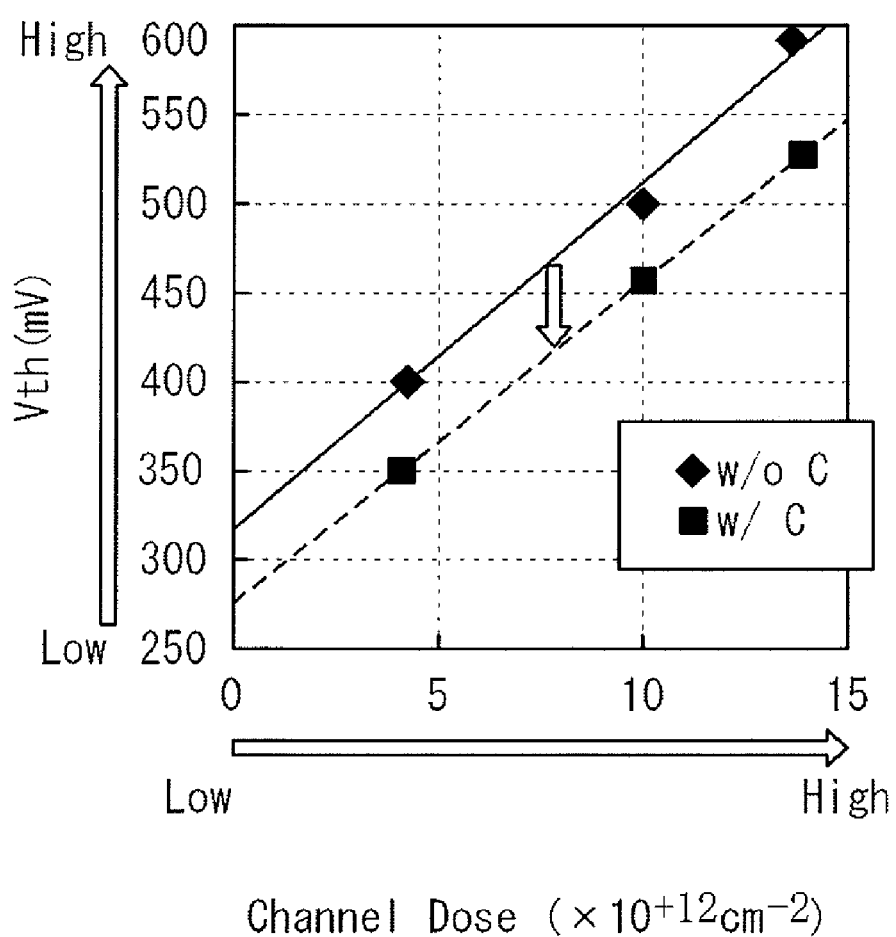
FIG. 5 is a graph showing a relationship between a threshold voltage and a dose of B of channel implantation.

The semiconductor device 1 according to the embodiment is different from the semiconductor device 2 in FIG. 1, in that metallic material is added in the gate insulating film 13. Addition of metallic material to the gate insulating film 13 makes it possible to increase a threshold voltage, as will be mentioned later. As a result, it is possible to reduce a shift (lower) in a threshold voltage caused by C implantation shown in FIG. 5. That is to say, it is possible not only to reduce random variations in transistors through C implantation but also to control a threshold voltage of a transistor at a desired value through introduction of metallic material.

Here, metallic material in the gate insulating film 13 is at least one kind of metals selected from Hf (hafnium), Zr (zirconium), Al (aluminum), La (lanthanum), Pr (praseodymium), Y (yttrium), Ti (titanium), Ta (tantalum), and W (tungsten). Hf and Zr are particularly preferable. These metallic materials are high-k materials for making the high-k gate insulating film 13, and also suitable for miniaturization of transistors.

Figure 7:
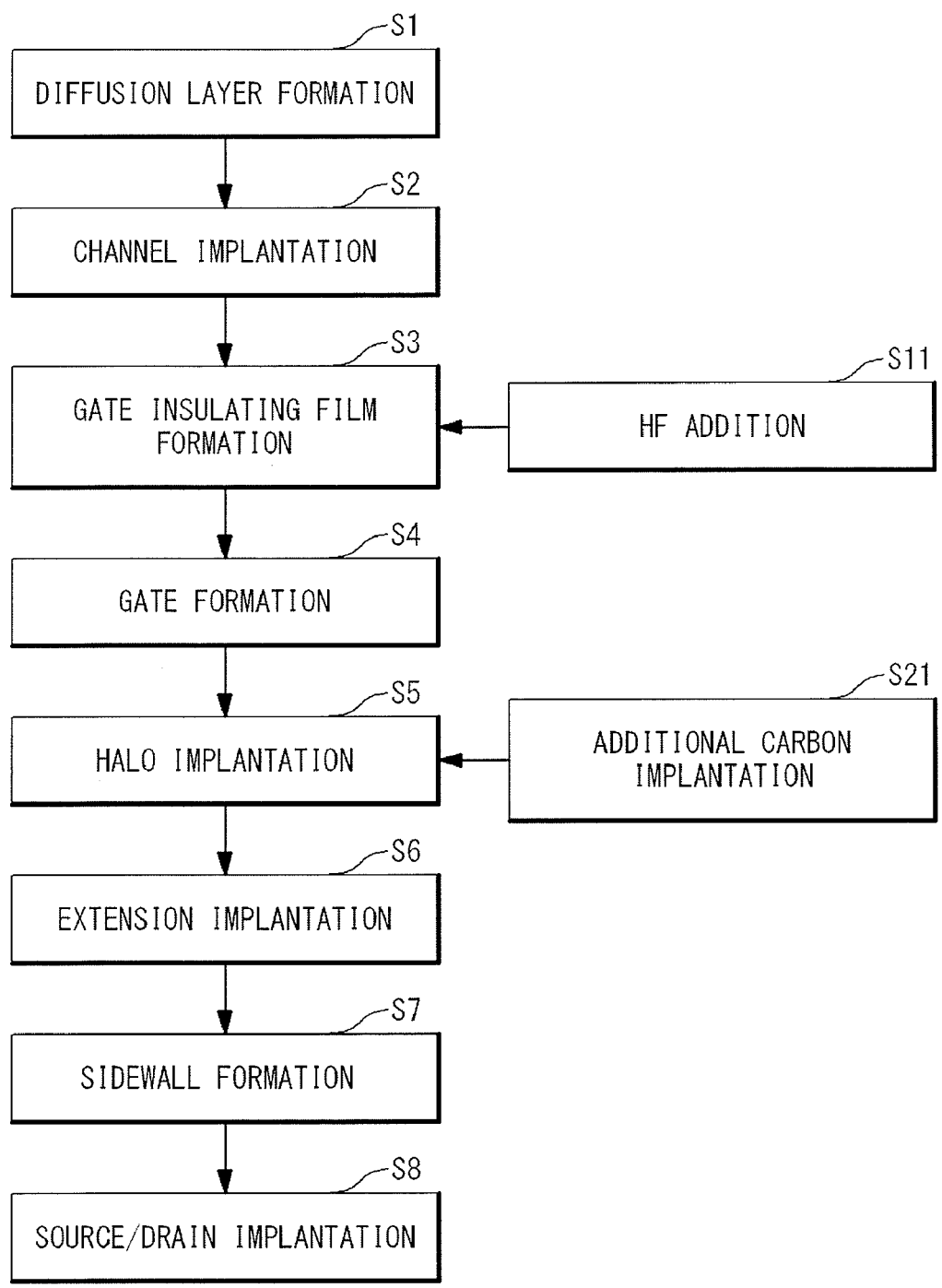
FIG. 7 is a flowchart showing a method for manufacturing a semiconductor device according to an embodiment of the present invention.

FIG. 7 is a flowchart showing a method for manufacturing a semiconductor device according to an embodiment of the present invention.

First, a diffusion layer is formed at a predetermined region in a surface layer of a semiconductor substrate (step S1). Next, for controlling a threshold voltage Vth, channel implantation is performed to the channel region 10 in the surface layer of the semiconductor substrate to form the channel impurity region 15 (step S2). Next, the gate insulating film 13 which is a SiON (silicon oxynitride) film is formed on the channel region 10 (step S3). At this time, the gate insulating film may be a $SiO_2$ (silicon oxide) film. After that, the gate electrode 12 is formed of polysilicon (step S4). Next, after the offset spacers 14 are formed, halo implantation and extension implantation are performed for the purpose of overlap adjustment under the gate (suppressing of the short-channel effect). That is to say, halo implantation is performed to form the halo regions 17 in the vicinity of the both ends of the channel region 10 (inside the semiconductor substrate) (step S5). Furthermore, extension implantation is performed to form the extension regions 16 in the vicinity of the both ends of the channel region 10 (the surface layer of the semiconductor substrate) (step S6). After that, the sidewalls 19 are formed (step S7), and source/drain implantation is performed to form the source/drain regions 11 (step S8).

When the gate insulating film 13 is formed (step S3), a metallic film (e.g. an Hf film) is formed on the gate insulating film 13 (step S11). That is to say, after a SiON film as a gate insulating film is formed by using a thermal oxidation method and a plasma nitridation method (or after a $SiO_2$ film is formed by using the thermal oxidation method) (step S3), a metallic film composed of the above metal is formed by using a CVD method or a sputtering method (step S11). As for a metal concentration, for example, an area density of $4 \times 10^{+14}/cm^2$ or less is preferable. $1.3 \times 10^{+14}/cm^2$ or less is more preferable. Metal in the metallic film diffuses and disperses into the SiON film (or $SiO_2$ film) through heat treatment for example in another process thereafter.

The implantation factors of the channel implantation, the halo implantation and the extension implantation used in the steps S2, S5, and S6 are B (boron), $BF_2$ (boron difluoride) and As (arsenic), respectively. An implantation condition of B is: 12 keV, $4 \times 10^{+12}$ to $12 \times 10^{+12}/cm^2$; an implantation condition of $BF_2$ is: 29 keV, $4.8 \times 10^{+13}/cm^2$, 15 degrees; and an implantation condition of As is: 7 keV, $5 \times 10^{+14}/cm^2$. At this time, P (phosphorus) and B (boron) maybe used instead of As and $BF_2$, respectively. Note that the above implantation conditions are just one example, and conditions used in a CMOS process flow in each generation are also possible.

When the halo implantation (step S5) is performed, carbon implantation (step S21) is applied before the halo implantation. An implantation condition of C (carbon) at this time is: 7 keV and $5 \times 10^{+14}/cm^2$. It is preferable that the C implantation condition should be an energy condition which corresponds to an active B depth under a transistor formed by halo implantation. It is also preferable that a dose of C should be two times or over two times a value of the sum of a dose of B at channel implantation and a dose of B at halo implantation. At this time, the C implantation may be applied after the halo implantation.

Figure 2:
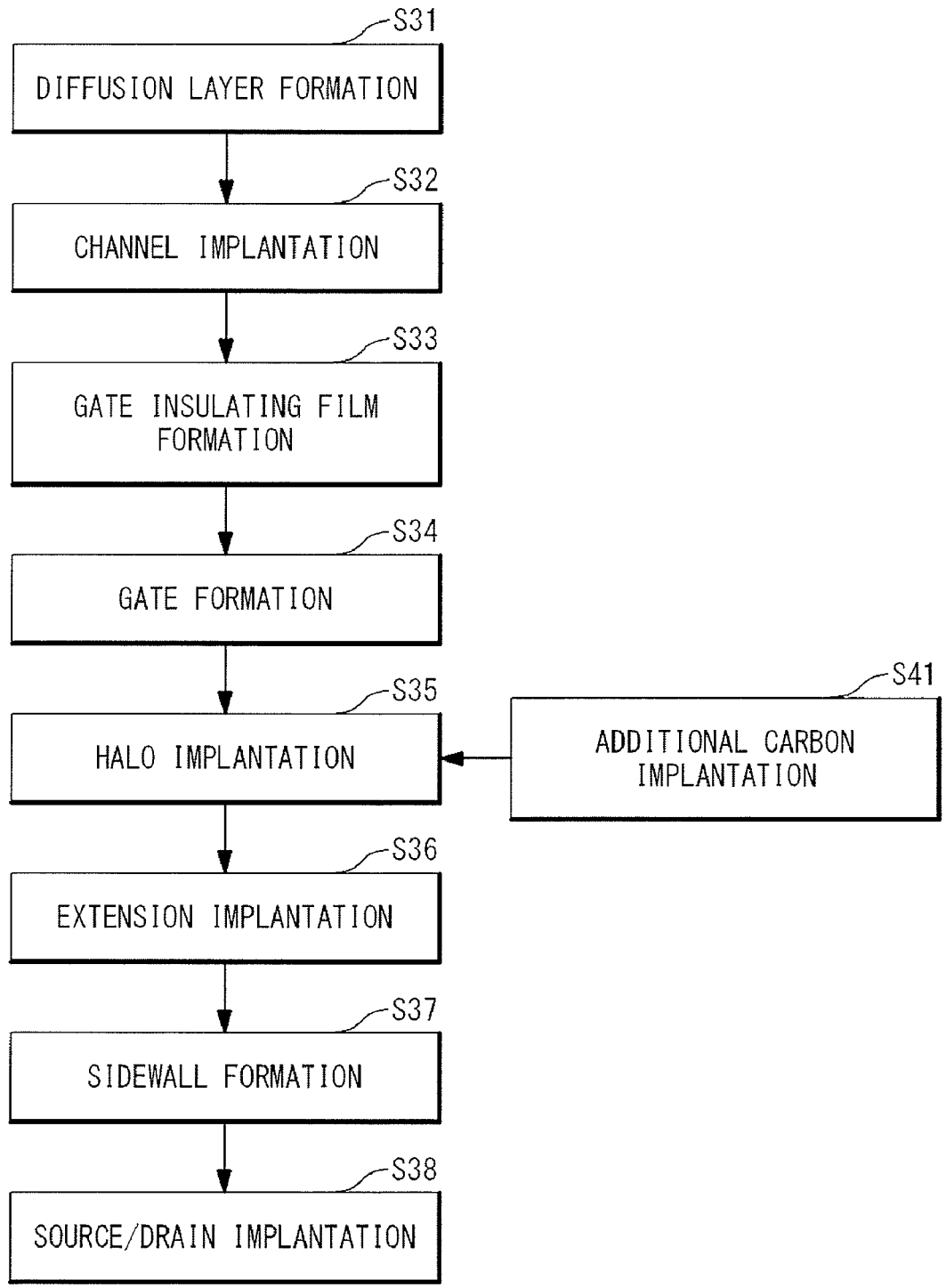
FIG. 2 is a flowchart showing a method for manufacturing the semiconductor device in FIG. 1.
Figure 3:
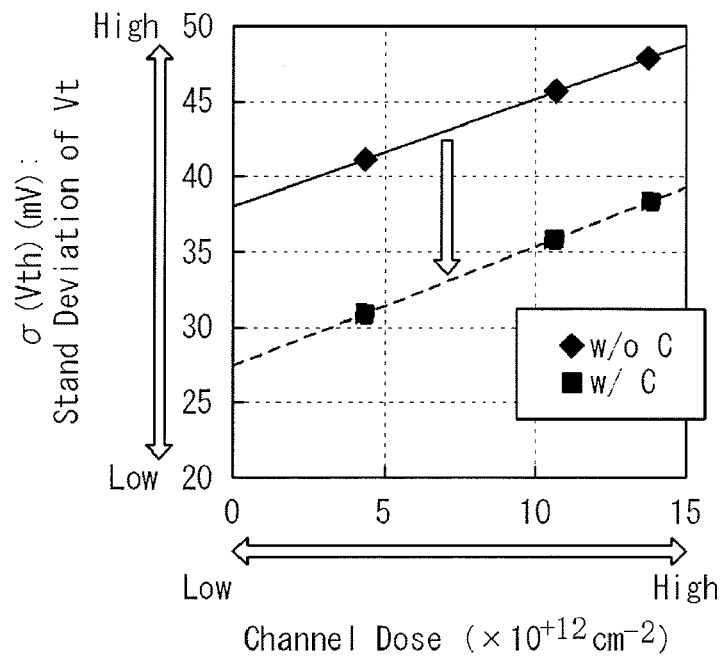
FIG. 3 is a graph showing a relationship between a random variation in a threshold voltage and a dose of B of channel implantation.
Figure 4:
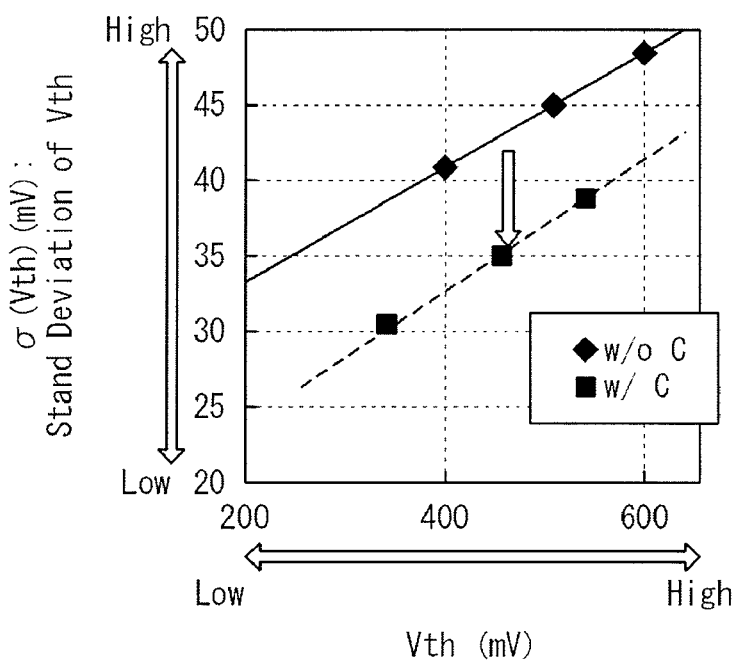
FIG. 4 is a graph showing a relationship between a random variation in a threshold voltage and a threshold voltage.

The flow in FIG. 7 according to the embodiment can be seen as a flow in which the Hf addition process (step S11) is added to the gate insulating film forming process (step S3) of the flow in FIG. 2.

Characteristics of an NMOS transistor manufactured according to the manufacturing method shown in FIG. 7 will be described.

Figure 8:
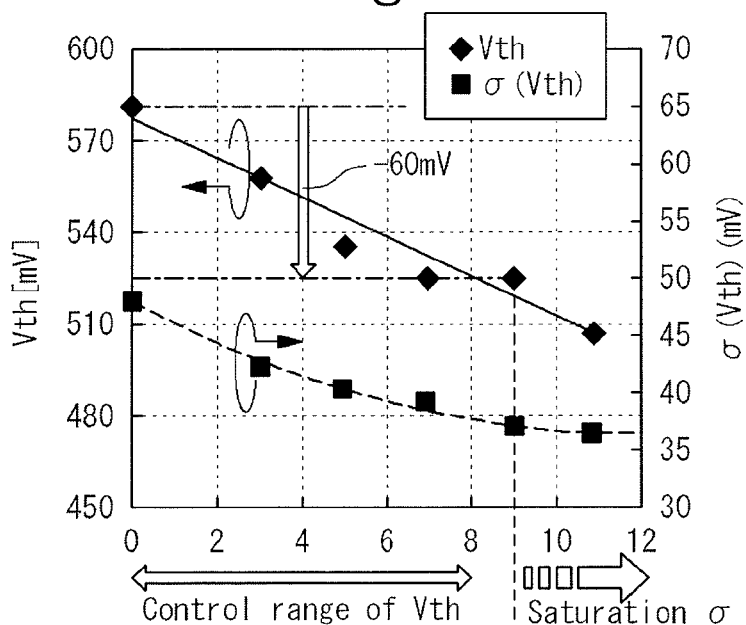
FIG. 8 is a graph showing a relationship between a threshold voltage and a random variation in a threshold voltage, and energy of C implantation.
Figure 9:
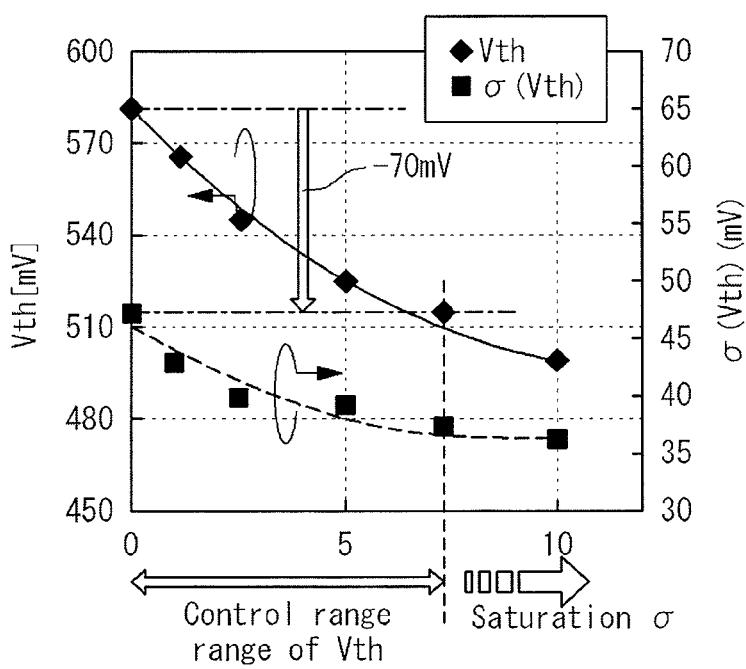
FIG. 9 is a graph showing a relationship between a threshold voltage and a random variation in a threshold voltage, and a dose of C of C implantation.

FIG. 8 is a graph showing a relationship between a threshold voltage Vth, a random variation in a threshold voltage Vth, and energy of C implantation. A vertical axis on the left side, a vertical axis on the right side, and a horizontal axis show a threshold voltage Vth, a random variation in a threshold voltage Vth (standard deviation $\sigma$ (Vth)), and energy of C implantation (Carbon Energy), respectively. FIG. 9 is a graph showing a relationship between a threshold voltage Vth, a random variation in a threshold voltage Vth, and a dose of C of C implantation. A vertical axis on the left side, a vertical axis on the right side, and a horizontal axis show a threshold voltage Vth, a random variation in a threshold voltage Vth ($\sigma$(Vth)), and a dose of C of C implantation, respectively. In FIGS. 8 and 9, diamonds and a solid line connecting the diamonds show a threshold voltage Vth. Squares and a broken line connecting the squares show a random variation in a threshold voltage $\sigma$ (Vth). In the manufacturing method, a process condition in each NMOS transistor is the same excluding a dose of C of C implantation. The dimensions of the measured NMOS transistor are 60 nm in an Lg (gate length) and 100 nm in a Wg (gate width).

Note that the dimensions and the implantation conditions for the channel implantation process, the halo implantation process, and the extension process (the steps S2, S5, and S6) of the compared NMOS transistor, are totally the same as the case of FIG. 2 as mentioned above.

With reference to FIG. 8, dependence of a threshold voltage Vth and a random variation in a threshold voltage $\sigma$ (Vth) on energy of C implantation will be described. The threshold voltage Vth linearly shifts to the negative side with respect to the C energy. That is to say, the threshold voltage Vth linearly and monotonically decreases with respect to the C energy. On the other hand, the random variation in a threshold voltage $\sigma$ (Vth) shifts to the negative side with respect to the C energy. That is to say, the random variation in a threshold voltage $\sigma$ (Vth) monotonically decreases with respect to the C energy. However, the decrease is saturated (stops) when the energy of C is equal to or more than 9 keV. That is to say, an improvement rate of $\sigma$ (Vth) results in saturation at approximately 20% compared with a case where C implantation is not applied (the C energy is 0 keV). For example, $\sigma$ (Vth) is approximately 48 mV when C implantation is not applied (when the energy of C is 0 keV) while $\sigma$ (Vth) is approximately 37 mV when C implantation is applied with the C energy of 9 keV, leading to the improvement of approximately 23%. While the threshold voltage Vth is approximately 582 mV when C implantation is not applied (when the energy of C is 0 keV), the Vth is approximately 522 mV when C implantation is applied with the C energy of 9 keV, leading to the reduction of 60 mV.

With reference to FIG. 9, dependence of a threshold voltage Vth and random variation in a threshold voltage $\sigma$ (Vth) on a dose of C will be described. The threshold voltage Vth shifts to the negative side with respect to the dose of C. That is to say, the threshold voltage Vth monotonically decreases with respect to a dose of C. On the other hand, the random variation in a threshold voltage $\sigma$ (Vth) also shifts to the negative side with respect to a dose of C. That is to say, the random variation in a threshold voltage σ (Vth) monotonically decreases with respect to a dose of C. However, the decrease is saturated (stops) when a dose of C is equal to or more than $7 \times 10^{+14}/cm^2$. That is to say, an improvement rate of σ (Vth) results in saturation at approximately 20% compared with a case where C implantation is not applied (where a dose of C is 0). For example, σ (Vth) is approximately 48 mV when C implantation is not applied (when a dose of C is 0) while σ (Vth) is approximately 37 mV when C implantation is applied with a dose of C of $7 \times 10^{+14}/cm^2$, leading to the improvement of approximately 23%. While the threshold voltage Vth is approximately 582 mV when C implantation is not applied (when a dose of C is 0), the Vth is approximately 512 mV when C implantation is applied with a dose of C of $7 \times 10^{+14}/cm^2$, leading to the reduction of 70 mV.

As shown in FIGS. 8 and 9, it has been revealed that a random variation in a threshold voltage σ (Vth) is saturated when the C implantation conditions (energy of C and a dose of C) exceed certain levels.

When judging from the results shown in FIGS. 8 and 9, a C implantation condition can be set as: 0 keV<C energy≦9 keV; and 0<a dose of C≦$7 \times 10^{+14}/cm^2$, in order to reduce random variations when C implantation is applied to the manufacturing method shown in FIG. 7. In a range which includes values greater than the above C implantation condition, the effect of reduction of random variations is saturated and the threshold voltage Vth is further reduced. That is, it is preferable that a higher limit of a concentration of C implanted into the halo regions is a concentration at which reduction of random variations is saturated. In a range which includes values smaller than the above C implantation condition, there is no effect of reduction of random variation. When C implantation is applied with the above C implantation condition, a shift amount of the threshold voltage Vth is approximately within 100 mV to the negative side.

Figure 10:
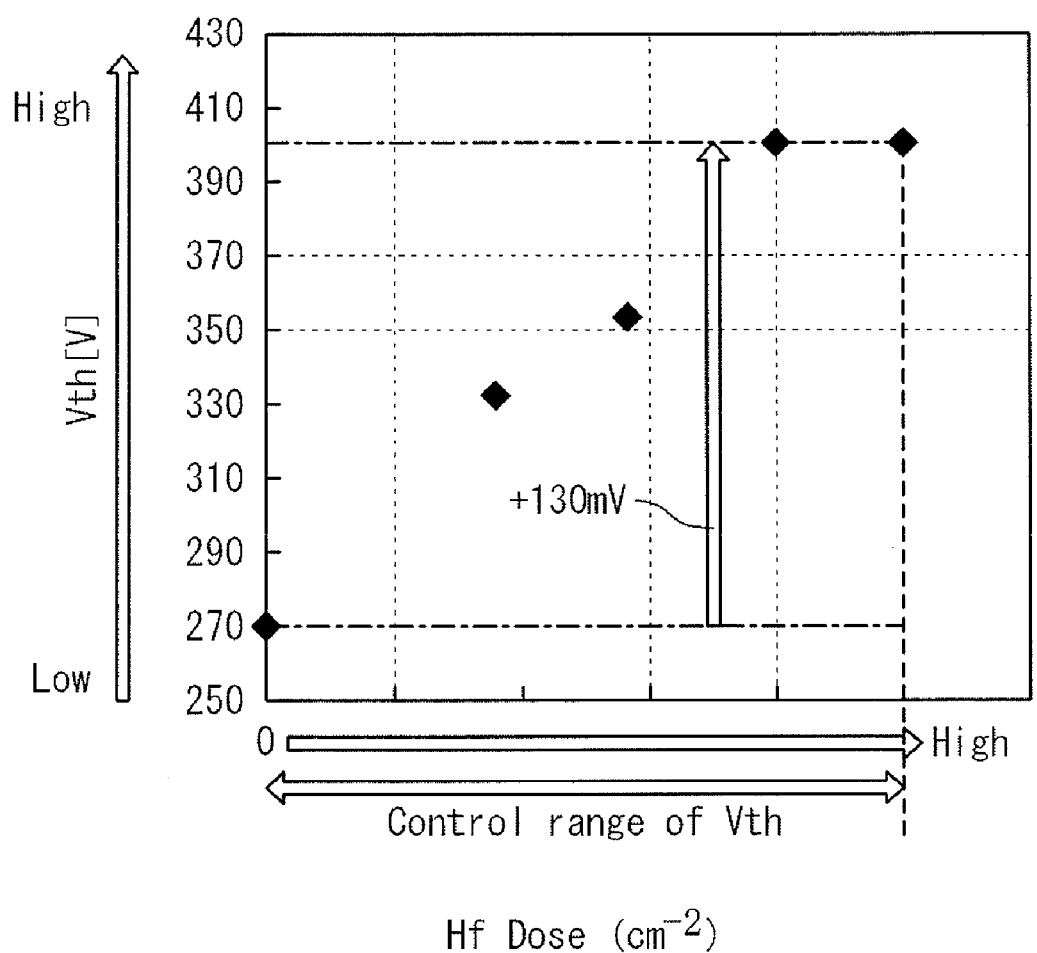
FIG. 10 is a graph showing a relationship between a threshold voltage and a dose of Hf.

Next, change in the threshold voltage Vth when a dose of Hf is added by adding the Hf addition process (step S11) in the gate insulating film forming process (step S3) will be described. FIG. 10 is a graph showing a relationship between a threshold voltage Vth and a dose of Hf. A vertical axis and a horizontal axis show a threshold voltage Vth and a dose of Hf, respectively. The threshold voltage Vth shits to the positive side by approximately 130 mV at a maximum depending on the dose of Hf added to the gate insulating film 13. Therefore, it is possible to compensate for a threshold voltage Vth reduced by approximately 100 mV due to C implantation with a dose of Hf.

From the above, the following effect can be obtained, when a C implantation process (step S21) is applied to the halo implantation process (step S5), by further applying the Hf addition process (step S11) to the gate oxide film forming process (step S3). That is to say, it is possible to reduce random variations σ (Vth) by approximately 20% at a maximum while maintaining transistor characteristics by improving a threshold voltage Vth as a result of the Hf addition process even if a threshold voltage Vth is shifted within approximately 100 mV due to the C implantation process.

It should be noted that a shift amount of a threshold voltage Vth due to application of the C implantation and a rate of reduction of random variations σ (Vth) are different depending on process conditions to be used. It should also be noted that an amount of improvement of a threshold voltage Vth due to a High-k film is different depending on kinds of metals of High-k materials.

It is considered that reduction of random variations σ (Vth) and decrease in a threshold voltage Vth are caused by suppressing the TED (Transient Enhanced Diffusion) of B (boron) due to the application of C (carbon) implantation as mentioned above. When suppressing the TED of B, it is important to control the total B, which is implanted at halo implantation and channel implantation into a transistor, by using C. That is to say, it is preferable as for a C implantation condition, that a C implantation depth should be equal to or greater than a B implantation depth at halo implantation. The detail will be described below.

Figure 11A:
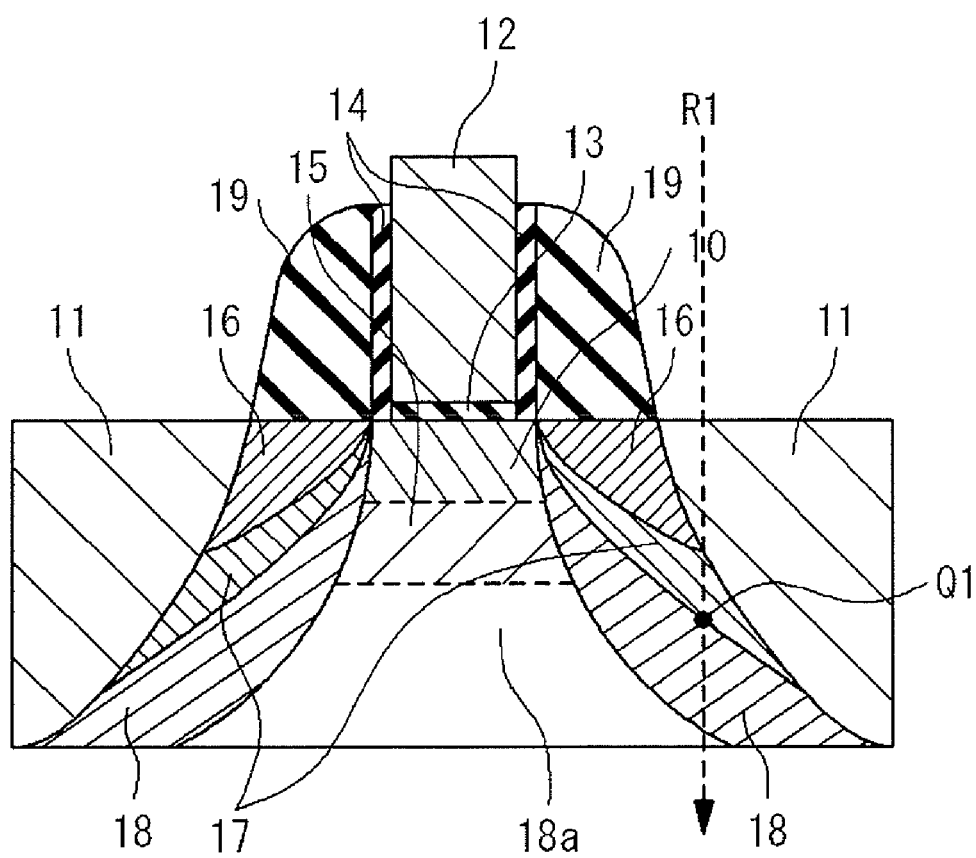
FIG. 11A is a diagram describing a profile image of an NMOS transistor.
Figure 11B:
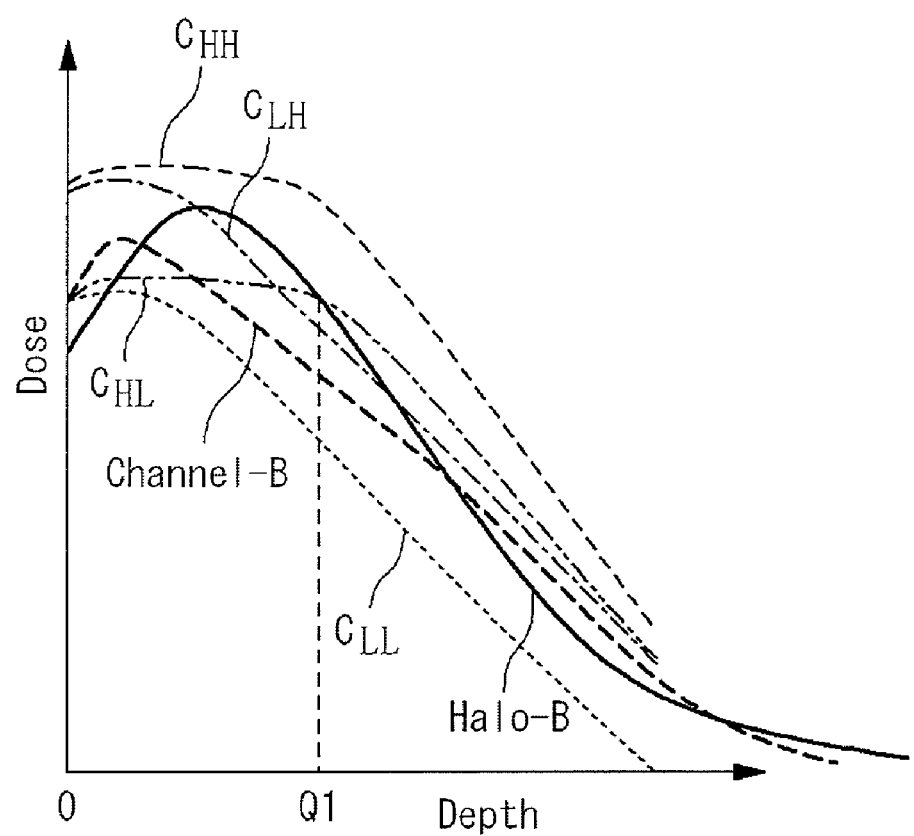
FIG. 11B is a diagram describing the profile image of the NMOS transistor.

FIGS. 11A and 11B are diagrams describing a profile image of an NMOS transistor. FIG. 11A is the same as FIG. 6. FIG. 11B shows a profile image in a depth direction of a semiconductor substrate at a position of R1 in FIG. 11A. A vertical axis and a horizontal axis show a dose and a depth from the surface of the semiconductor substrate, respectively. $C_{HH}$ shows a profile of (relatively) high-energy/(relatively) high-dose C implantation. $C_{LH}$ shows a profile of (relatively) low-energy/(relatively) high-dose C implantation. $C_{HL}$ shows a profile of (relatively) high-energy/(relatively) low-dose C implantation. $C_{LL}$ shows a profile of (relatively) low-energy/ (relatively) low-dose C implantation. Channel-B shows a profile of channel implantation (B). Halo-B shows a profile of halo implantation (B). Note that concrete values of energy and a dose are varied and set according to a dimension of an element, a film thickness and film quality and the like to be used for example, and thus will not be mentioned here.

As mentioned above, in order to control the total B by using C, it is preferable that an implantation depth of C at C implantation should be equal to or more than an implantation depth of B at halo implantation. Here, it is considered that a C implantation profile has saturated distribution from the surface side of the semiconductor substrate without having a peak, and shows a fall in a dose from a given depth depending on energy (e.g. the profiles of $C_{HH}$, $C_{HL}$, $C_{LH}$, and $C_{LL}$). Therefore, it is considered that the TED of B on the side of the surface of the semiconductor substrate can be suppressed by increasing a dose of C of C implantation more than a dose of B of halo implantation. That is, it is preferable that a concentration of C implanted into the halo regions is higher than a concentration of B (P-type impurities) implanted into the halo regions in the semiconductor substrate.

For example, a high-energy condition should be selected so that B distribution of halo implantation (Halo-B) shown in FIG. 11B is covered. In particular, a high-energy condition ($C_{HH}$ or $C_{HL}$) should be selected so that a portion deeper than the lower sides of the halo regions 17 (Q1) of the B distribution (Halo-B) is covered. Furthermore, it is considered, when the condition ($C_{HH}$) with which C (C distribution) exceeds the total B (B distribution) is selected, that greater effect suppressing TED of B can be obtained and random variations can be more greatly reduced. The results are shown in FIGS. 8 and 9.

Since transistor characteristics of a short-channel region are strongly affected by B distribution of halo implantation in particular, suppressing TED of B is effective for reduction of random variations. Therefore, application of the C implantation process to the halo implantation process is effective in a short-channel region.

At this time, TED suppression of the total B included in the halo regions is saturated and a rate of reduction of random variations tends to be saturated when energy and a dose of the C implantation condition exceed certain values. Therefore, C conditions should be set with a peak position of the B distribution and a dose of a total B as borderlines. Effect of the present embodiment will be described below.

Figure 12:
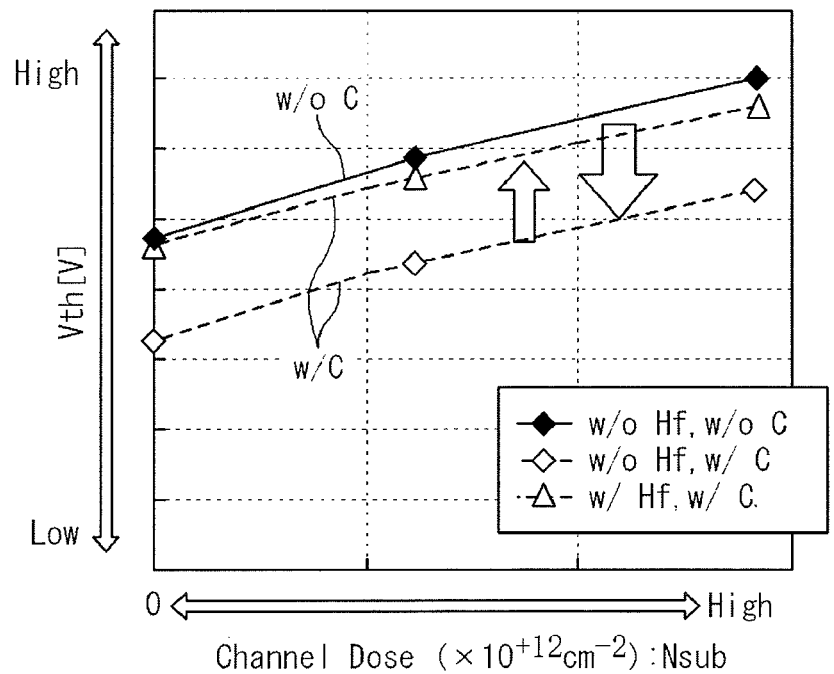
FIG. 12 is a graph showing a relationship between a threshold voltage and a dose of B of channel implantation.
Figure 13:
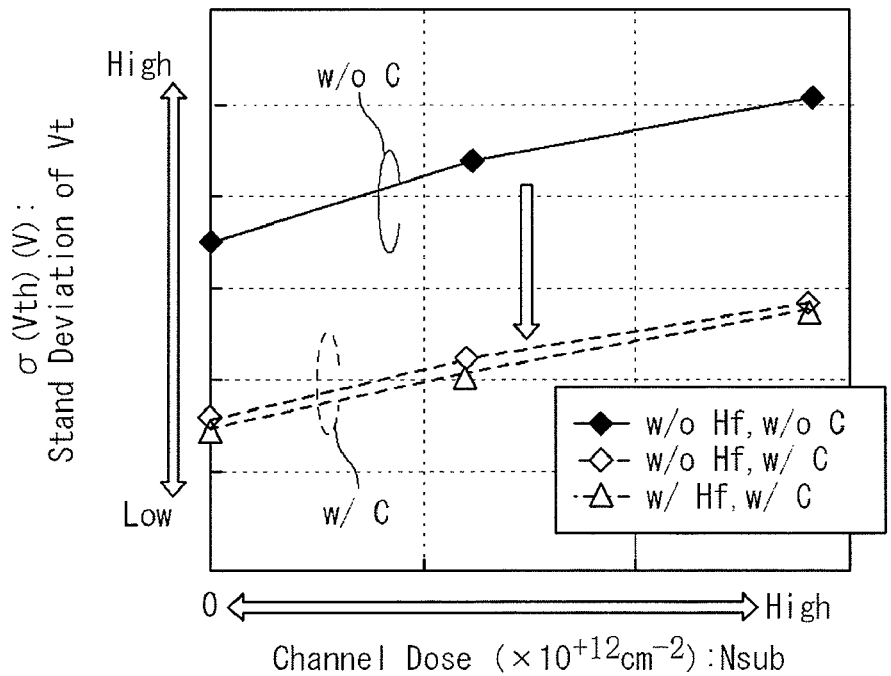
FIG. 13 is a graph showing a relationship between a random variation in a threshold voltage and a dose of B of channel implantation.

FIG. 12 is a graph showing a relationship between a threshold voltage Vth and a dose of B of channel implantation. A vertical axis and a horizontal axis show a threshold voltage Vth and a dose of B of channel implantation (Channel Dose), respectively. FIG. 13 is a graph showing a relationship between a random variation in a threshold voltage Vth and a dose of B of channel implantation. A vertical axis and a horizontal axis show a random variation in a threshold voltage Vth (standard deviation σ (Vth)) and a dose of B of channel implantation (Channel Dose), respectively. In FIGS. 12 and 13, solid diamonds and a solid line connecting the solid diamonds show a case where the C implantation (step S21) is not applied at the time of halo implantation and the Hf film formation (step S11) is not applied at the time of formation of a gate insulating film. Open diamonds and a broken line connecting the open diamonds show a case where the C implantation (step S21) is applied at the time of halo implantation but the Hf film formation (step S11) is not applied at the time of the formation of a gate insulating film. Open triangles and a broken line connecting the open triangles show a case where the C implantation (step S21) is applied at the time of halo implantation and the Hf film formation (step S11) is applied at the time of the formation of a gate insulating film. In the manufacturing method, a process condition is the same for each NMOS transistor, excluding a dose of B of channel implantation and the application of the C implantation.

As shown in FIG. 12, a threshold voltage Vth is reduced as a result of the application of only the C implantation process (from the solid diamonds to the open diamonds). By further applying the Hf addition process however, the reduction in the threshold voltage Vth can be recovered to reach the threshold voltage Vth which is approximately equal to the threshold voltage Vth without the C implantation process (from the open diamonds to the open triangles). As shown in FIG. 13, the random variation σ(Vth) in the threshold voltage Vth is reduced as a result of the application of only the C implantation process (from the solid diamonds to the open diamonds). When the Hf addition process is further applied, the random variation σ (Vth) hardly changes (from the open diamonds to the open triangles). From the above, application of both the C implantation process and the Hf addition process makes it possible to greatly improve the random variation σ(Vth) while transistor characteristics are maintained. That is to say, by adding the Hf addition, it is possible to compensate for reduction in the threshold voltage Vth caused when the C implantation is applied, and maintain reduction of the random variation σ (Vth).

In the manufacturing method of FIG. 7, the C implantation process (step S21) is performed immediately before the halo implantation process (step S5). This is because a region where B of halo implantation is implanted becomes amorphous due to C implantation, and B implantation thereafter is easy to control. However, the present embodiment is not limited to the example. That is to say, C implantation may be performed at any timing before the source/drain implantation (step S8) if a condition is satisfied in which C can be implanted into a desired position. For example, the C implantation may be performed after the halo implantation (step S5) or after the extension implantation (step S6).

In the embodiment, the following modifications can be considered.
(Modification 1)

In the gate forming process (step S4), not polysilicon but metal (metal gate) may be used as the gate electrode 12.

A metallic material used for a metal gate may be selected from various metallic materials with different work functions. By considering compatibility of adhesion properties at an interface with the gate insulating film 13, thermal stability and so on, the most suitable material in accordance with each LSI process is selected.

Following the advancement of miniaturization processes, improvement of transistor performance following reduction in voltage is essential. For this reason, metal gate technology has been begun to be introduced for the purpose of reduction in a Tinv, considering the relationship that Ion (on-state current) is proportional to Cox (gate capacitance) and Cox (gate capacitance) is proportional to ∈/Tinv (∈: a dielectric constant of a gate insulating film, Tinv: equivalent oxide thickness of a gate insulating film). In the case of a metal gate however, since a Tinv corresponds to a physical thickness (Tox) of a gate insulating film, thinning a physical thickness of a gate insulating film makes a gate leakage current increase, thereby increasing an off-leakage current. Therefore, by paying attention to ∈ to use a High-k film with a dielectric constant (high ∈) higher than that of a $SiO_2$ film or a SiON film which is conventionally used, transistor characteristics can be improved without changing a Tox. For this reason, a technique which is a combination of a High-k film (high dielectric constant) and metal gate technology has been begun to be employed for miniaturization processes after the 45 nm generation as shown in a non-patent literature 5. Here, the non-patent literature 5 is: C. H. Jan et al., "A 32 nm SoC Platform Technology with 2nd Generation High-k/Metal Gate Transistors Optimized for Ultra Low Power, High Performance, and High Density Product Applications" in IEDM. Tech. Dig., 2009.

Since a Tinv can be reduced compared with a conventional case by using both the metal gate technology and the High-k technology together, random variations are further reduced in view of the criteria expression of the Pelgrom plot. In the case of the metal gate technology, where materials with various work functions are available, a material can be selected in accordance with setting of a target threshold voltage Vth (non-patent literature 5). In the case of an NMOS transistor for example, a metal such as La, Hf, Ta, and Zr as a simple substance or combinations thereof can be used as the gate electrode 12 in accordance with setting of a target threshold voltage Vth. Consequently, it is possible to compensate for reduction in a threshold voltage Vth due to C implantation.

Therefore, reduction in random variations due to C implantation in addition to reduction in random variations due to reduction in a Tinv are possible while maintaining transistor characteristics by applying the C implantation process (step S21) to the halo implantation process (step S5) in the same way as the above-mentioned embodiment, making it possible to produce greater effect.
(Modification 2)

Figure 14:
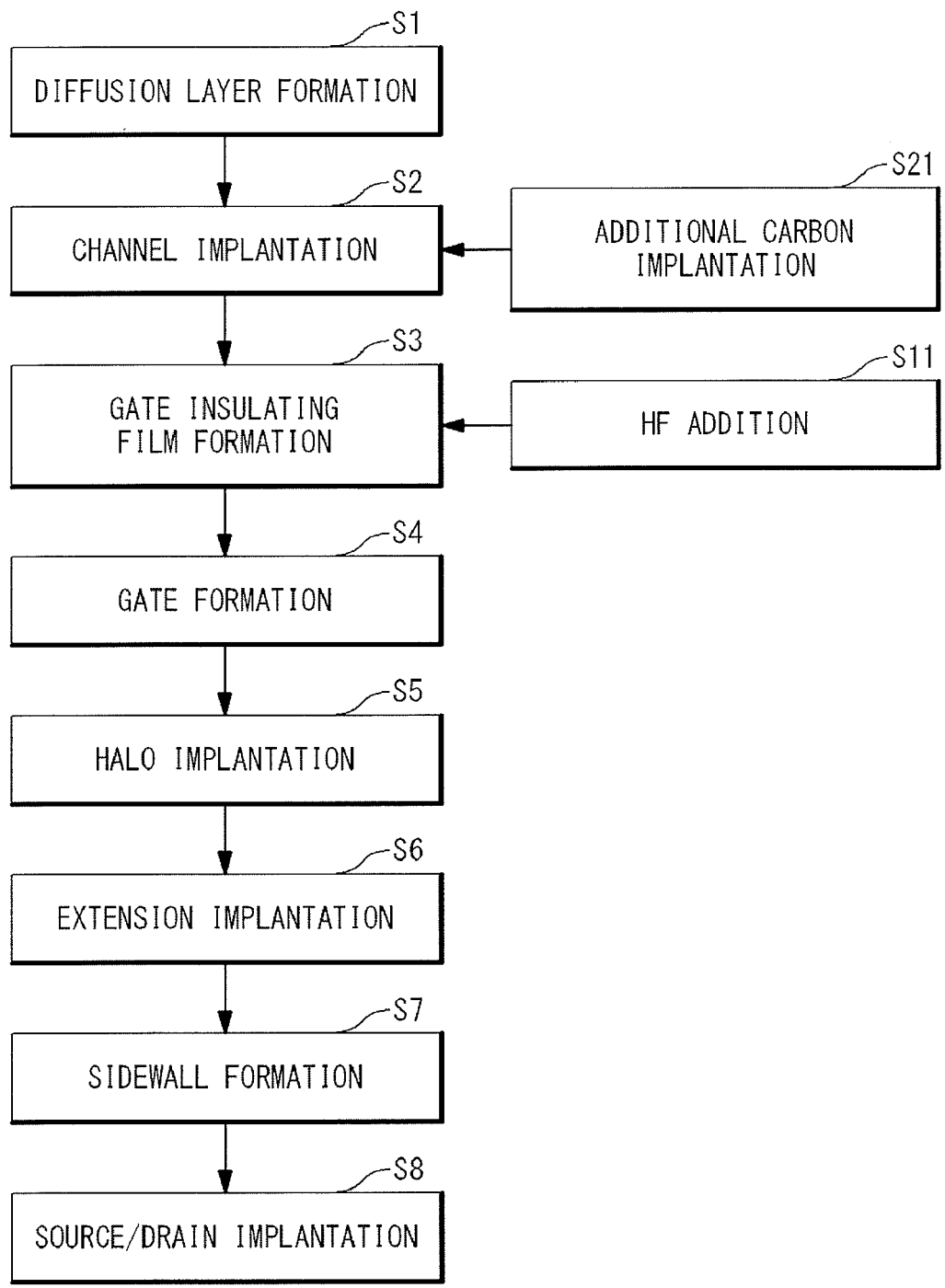
FIG. 14 is another flowchart showing a method for manufacturing a semiconductor device according to an embodiment of the present invention.

When considering a long channel side where the influence of B of halo implantation (Halo-B) is reduced, a method in which C implantation is performed to a channel side can be considered. FIG. 14 is another flowchart showing a method for manufacturing a semiconductor device according to an embodiment of the present invention. FIG. 14 is different from FIG. 7 in that the C implantation process (step S21) is performed to a channel region 10 immediately before the channel implantation process (step S2). The C implantation immediately before the channel implantation process prevents B of the channel impurity region 15 from being segregated on the surface of the channel region 10.

Figure 15A:
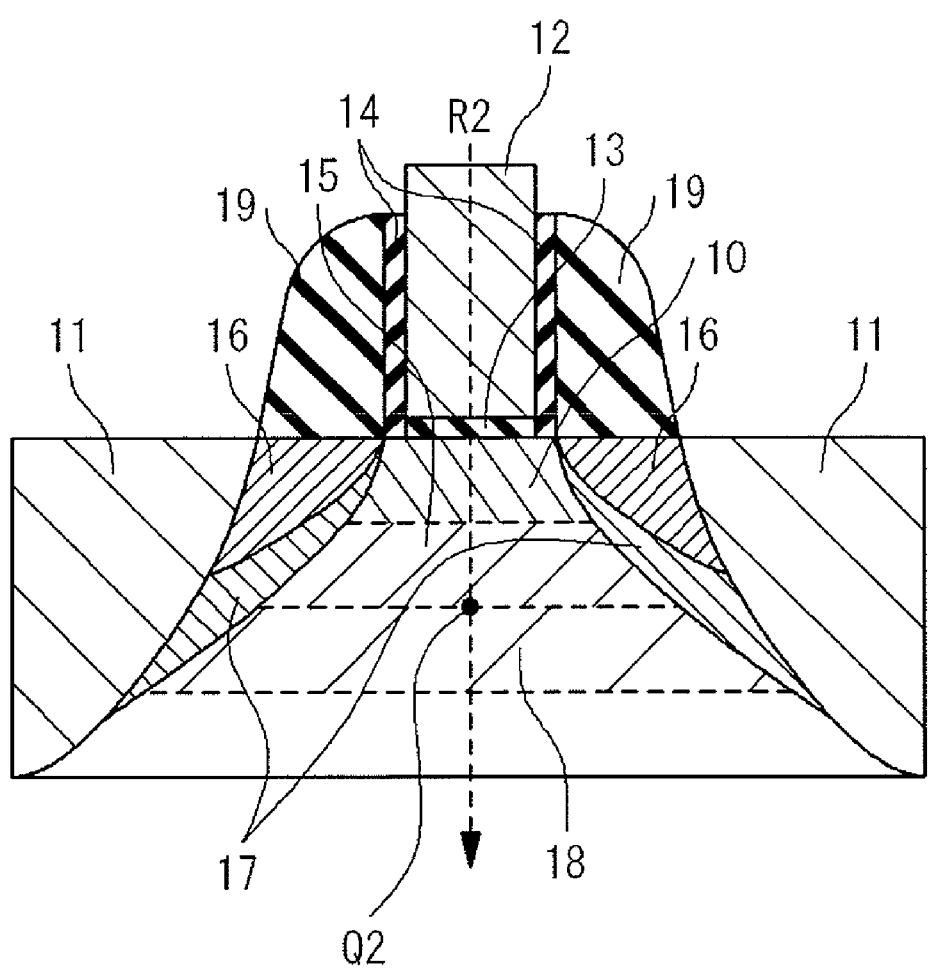
FIG. 15A is a diagram describing a profile image of an NMOS transistor.
Figure 15B:
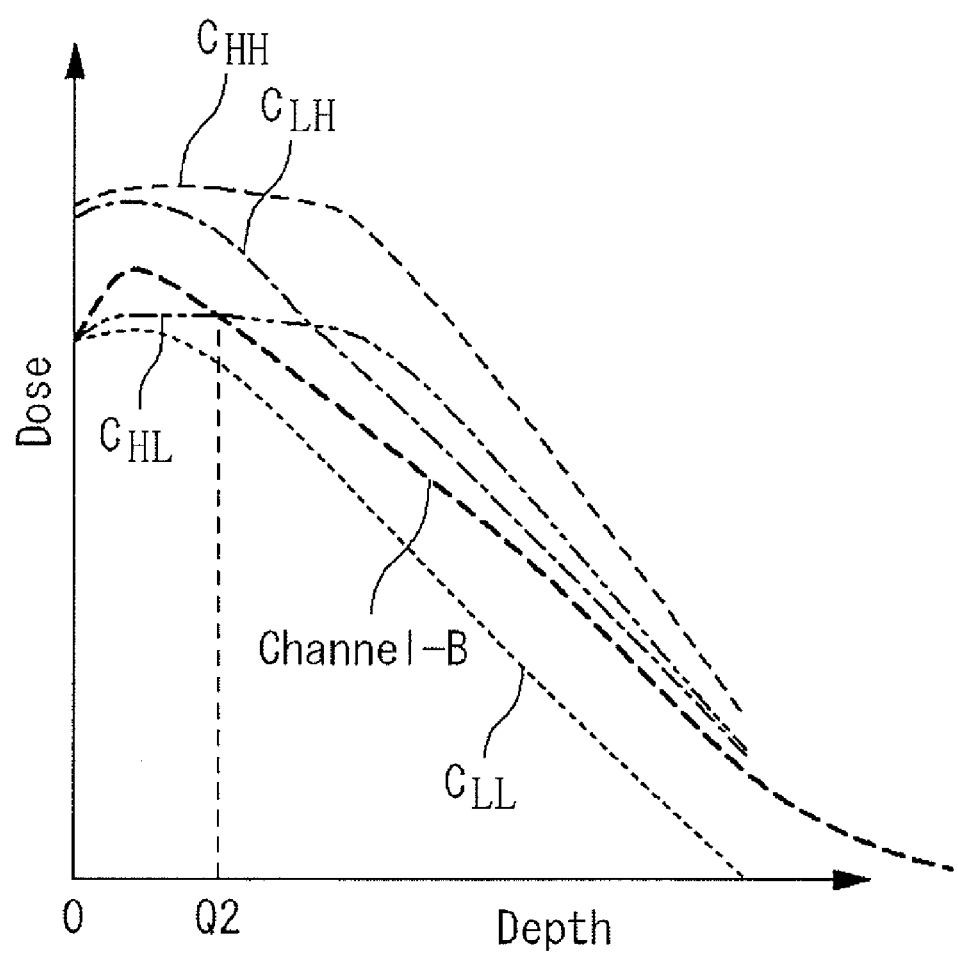
FIG. 15B is a diagram describing the profile image of the NMOS transistor.

FIGS. 15A and 15B are diagrams describing a profile image of an NMOS transistor. FIG. 15A is mostly the same as FIG. 6. However, carbon is implanted from the channel region 10 to an inside 18. FIG. 15B shows a profile image in a depth direction of a semiconductor substrate at a position of R2 in FIG. 15A. Note that a vertical axis, a horizontal axis, $C_{HH}$, $C_{LH}$, $C_{HL}$, $C_{LL}$, and Channel-B are the same as the case of FIG. 11B.

As mentioned above, it is preferable that an implantation depth of C at the time of C implantation should be equal to or more than an implantation depth of B at the time of channel implantation, in order to control the total B by using C. By increasing a dose of C of C implantation greater than a dose of B of channel implantation, the TED of B on the surface side of the semiconductor substrate can be reduced. That is, it is preferable that a concentration of C implanted into the channel region is higher than a concentration of B (P-type impurities) implanted into the channel region in the semiconductor substrate.

For example, a condition with which B distribution of channel implantation (Channel-B) shown in FIG. 15B is covered should be selected. In particular, conditions ($C_{HH}$, $C_{HL}$ or $C_{LH}$) with which a portion deeper than the lower side (Q2) of the channel region 15 of the B distribution (Channel-B) is covered should be selected. Furthermore, it is considered, when a condition ($C_{HH}$ or $C_{LH}$) with which C (C distribution) exceeds the total B (B distribution) is selected, that greater effect suppressing TED of B can be obtained and random variations can more greatly be reduced.

Therefore, application of the C implantation to the channel implantation process can also obtain the same effect as the case where the C implantation is applied to the halo implantation process as shown in FIG. 7. For example, the effect as shown in FIG. 12 and FIG. 13 can be obtained. Furthermore, the same effect can be obtained when C implantation is applied to both the halo regions and the channel region.

Here, the C implantation process (step S21) is performed immediately before the channel implantation process (step S2). This is because a region into which B of channel implantation is implanted becomes amorphous due to C implantation, and B implantation thereafter is easy to control. However, the present embodiment is not limited to the example. That is to say, C implantation maybe performed immediately after the channel implantation process (step S2) if a condition that implantation is possible into a desired position is satisfied. It is apparent that the present invention is not limited to the above embodiment, but may be modified and changed without departing from the scope and spirit of the invention. Additionally, the contents of the embodiments and the modifications can be combined and/or replaced with each other unless technical contradictions do not occur.

Although the present invention has been described above in connection with several exemplary embodiments thereof, it would be apparent to those skilled in the art that those exemplary embodiments are provided solely for illustrating the present invention, and should not be relied upon to construe the appended claims in a limiting sense.

What is claimed is:

1. A method of manufacturing N-type MOSFET comprising:
   implanting a p-type dopant into in a surface layer of a semiconductor substrate to form a channel region;
   forming a gate insulating film including High-k material and a gate electrode on said channel region;
   implanting a p-type dopant into both ends of said channel region in an inner portion of said semiconductor substrate to form halo regions;
   implanting a p-type dopant into both ends of said channel region in a surface layer of said semiconductor substrate to form extension regions;
   wherein one of said step of forming said channel region and said step of forming halo regions includes:
   implanting C into one of said channel region and said halo regions,
   wherein the amount of said High-k material included in the gate insulating film is an amount that increases a threshold voltage by an amount that compensates for a decrease of said threshold voltage caused by said implanting of C.

2. The method of manufacturing N-type MOSFET according to claim 1, wherein said High-k material includes Hf.

3. The method of manufacturing N-type MOSFET according to claim 1, wherein a concentration of C implanted into said one of said channel region and said halo regions is higher than a concentration of P-type impurities implanted into one of said channel region and said halo regions.

4. The method of manufacturing N-type MOSFET according to claim 1, wherein a higher limit of a concentration of C implanted into said one of said channel region and said halo regions is a concentration at which reduction of random variations is saturated.

5. The method of manufacturing N-type MOSFET according to claim 1, wherein a higher limit of energy of C implanted into said one of said channel region and said halo regions is energy at which reduction of random variations is saturated.

6. The method of manufacturing N-type MOSFET according to claim 1, wherein said gate electrode is formed of metal, and
   wherein said amount of said High-k material included in the gate insulating film and a type of said metal are selected so as to compensate for said decrease of said threshold voltage caused by said implanting of C.

7. The method of manufacturing N-type MOSFET according to claim 2, wherein a concentration of C implanted into said one of said channel region and said halo regions is higher than a concentration of P-type impurities implanted into one of said channel region and said halo regions.

8. The method of manufacturing N-type MOSFET according to claim 7, wherein a higher limit of a concentration of C implanted into said one of said channel region and said halo regions is a concentration at which reduction of random variations is saturated.

9. The method of manufacturing N-type MOSFET according to claim 7, wherein a higher limit of energy of C to be implanted into said one of said channel region and said halo regions is energy at which reduction of random variations is saturated.

10. The method of manufacturing N-type MOSFET according to claim 2, wherein said gate electrode is formed of metal, and
    wherein said inclusion amount of said High-k material and a type of said metal are selected so as to compensate for said decrease of said threshold voltage caused by said implanting of C.

11. A N-type MOSFET comprising:
    a channel region configured to be formed in a surface layer of a semiconductor substrate;
    extension regions configured to be formed on both ends of said channel region in a surface layer of said semiconductor substrate;
    halo regions configured to be formed under said extension regions;
    a gate insulating film configured to be formed on said channel region and include High-k material; and
    a gate electrode configured to be formed on said gate insulating film,
    wherein C is included in one of said channel region and said halo regions, and wherein the amount of said High-k material included in the gate insulating film is an amount of High-k material that increases a threshold voltage by an amount that compensates for a decrease of said threshold voltage caused by said inclusion of C.

12. The N-type MOSFET according to claim 11, wherein said High-k material includes Hf.

13. The N-type MOSFET according to claim 11, wherein a concentration of C included in said one of said channel region and said halo regions is higher than a concentration of P-type impurities included in one of said channel region and said halo regions.

14. The N-type MOSFET according to claim 11, wherein a higher limit of a concentration of C included in said one of said channel region and said halo regions is a concentration at which reduction of random variations is saturated.

15. The N-type MOSFET according to claim 11, wherein a higher limit of energy of C intoduced into said one of said channel region and said halo regions by ion-inplantation is energy at which reduction of random variations is saturated.

16. The N-type MOSFET according to claim 11, wherein said gate electrode is formed of metal, and
wherein said amount of said High-k material included in the gate insulating film and a type of said metal are selected so as to compensate for said decrease of said threshold voltage caused by said inclusion of C.

17. The N-type MOSFET according to claim 12, wherein a concentration of C included in said one of said channel region and said halo regions is higher than a concentration of P-type impurities included in one of said channel region and said halo regions.

18. The N-type MOSFET according to claim 17, wherein a higher limit of a concentration of C included in said one of said channel region and said halo regions is a concentration at which reduction of random variations is saturated.

19. The N-type MOSFET according to claim 17, wherein a higher limit of energy of C introduced into said one of said channel region and said halo regions by ion-implantation is energy at which reduction of random variations is saturated.

20. The N-type MOSFET according to claim 12, wherein said gate electrode is formed of metal, and
wherein said inclusion amount of said High-k material and a type of said metal are selected so as to compensate for said decrease of said threshold voltage caused by said inclusion of C.

* * * * *